(12) United States Patent
Shen (10) Patent No.: US 7,632,534 B2
(45) Date of Patent: Dec. 15, 2009

(54) METHOD AND PROGRAM FOR SIMULATING OCCURRENCE OF AIR POCKET

(75) Inventor: Jianrong Shen, Tokyo (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 364 days.

(21) Appl. No.: 11/480,990

(22) Filed: Jul. 6, 2006

(65) Prior Publication Data

US 2007/0010977 A1 Jan. 11, 2007

(30) Foreign Application Priority Data

Jul. 7, 2005 (JP) ............................ P2005-198776

(51) Int. Cl.
*C23C 16/52* (2006.01)

(52) U.S. Cl. .............................................. 427/8; 703/6

(58) Field of Classification Search ...................... 427/8; 703/6

See application file for complete search history.

(56) References Cited

FOREIGN PATENT DOCUMENTS

| EP | 1 134 031 A2 | 9/2001 |
|----|--------------|--------|
| JP | 10-45037 | 2/1998 |
| JP | 2000 057200 | 2/2000 |
| JP | 2000051750 A * | 2/2000 |

OTHER PUBLICATIONS

European Search Report dated Nov. 20, 2006.
Caboussat, Alexandre, "Analysis and numerical simulation of free surface flows" [Online] 2003, pp. 1-140 hhtp://biblion.epfl.ch/EPFL/theses/2003/2893/EPFL_TH2893.pdf.

* cited by examiner

*Primary Examiner*—Roberts Culbert
(74) *Attorney, Agent, or Firm*—McGinn IP Law Group, PLLC (57) ABSTRACT

A method of simulating an occurrence of an air pocket in an object to be coated is provided with steps of: dividing an object and a periphery of the object into regions; dividing the object into elements; determining whether an element is filled with air or liquid coating material; determining whether the element to be filled with air is filled with air or liquid coating material, by referring to a database. The database is structured by collecting data relating an angle of incline of the object, a surface tension caused between the object and the liquid coating material, a flow velocity of the liquid coating material in the coating material tank, and a direction of flow of the liquid coating material in the tank, when an air bubble adhering to the object is removed therefrom.

21 Claims, 9 Drawing Sheets

METHOD AND PROGRAM FOR SIMULATING OCCURRENCE OF AIR POCKET

The present application claims foreign priority based on Japanese Patent Application No. P.2005-198776, filed on Jul. 7, 2005, the contents of which are incorporated herein by reference.

BACKGROUND OF THE INVENTION

1. Field of the Invention

The present invention relates to a method of simulating an occurrence of an air pocket in an object to be coated by being immersed in a coating material tank and a program executable by a computer for executing the method. More particularly, the present invention relates to a method and a program for simulating an occurrence of an air pocket in an object to be coated by taking an angle of inclination of an object to be coated and a flow velocity of a liquid coating material in the coating material tank, into consideration.

2. Related Art

Coating methods, for example, a plating method of immersing an object to be coated, such as a semiconductor or a vehicle body of an automobile, in a coating material tank filled with molten metal to thereby coat the object, and an electrodeposition coating method of immersing an object to be coated in a coating material tank filled with electrodeposition liquid to thereby coat the object, have advantages in that a coating film is substantially uniform in thickness, and that also, a weld part of the object can be coated. On the other hand, such coating methods have a drawback in that in a case where an air pocket called a "air pocket" occurs in a concave portion provided in a complicatedly shaped component or in a depressed portion of the inner surface of a hood or a roof, or the bottom surface of a floor of an automobile, no coating film can be formed in this portion.

Accordingly, the shape of the object is appropriately designed to prevent an occurrence of an air pocket. Then, the object is immersed (see, for example, JP-A-10-045037).

Meanwhile, it can preliminarily be determined by a known analysis method, which utilizes a free surface, whether an air pocket occurs in the object. Incidentally, sometimes, air bubbles adhere to the bottom portion of an inclined portion of the object due to a surface tension and to an intermolecular force, so that an air pocket occurs. Whether the bubbles having once adhered to the object depends upon an angle of inclination of the object, a surface tension caused between the object and the liquid coating material, the flow velocity of the liquid coating material filled in the coating material tank, and the direction of flow of the liquid coating material. A related analysis method does not take this respect into account. Thus, the related analysis method cannot necessarily achieve high-precision simulateion of an occurrence of an air pocket in the object.

A problem to be solved by the invention is to provide a method and a program executable by a computer for executing the method for simulating an occurrence of an air pocket in an object to be coated with high accuracy in consideration of an angle of inclination of the object, a surface tension caused between the object and a liquid coating material, the flow velocity of the liquid coating material filled in a coating material tank, and the direction of flow of the liquid coating material.

SUMMARY OF THE INVENTION

In accordance with one or more embodiments of the present invention, as a first aspect of the invention, a method of simulating an occurrence of an air pocket in an object to be coated, is provided with:

a regions dividing step of dividing a shape data of the object to be immersed in a coating material tank and a data of a periphery of the object into a plurality of regions;

an elements dividing step of dividing the shape data of the object into a plurality of elements;

a first determination step of determining whether an attribute regarding an element of the plurality of elements is air or liquid; and a second determination step of determining whether the attribute regarding the element, which is determined in the first determination step that the attribute regarding the element is air, is air in a region to which the element belongs, by referring to a database, wherein the database relates to information indicating whether an air bubble adhering to the object is removed therefrom, based on an angle of incline of the object, a surface tension caused between the object and the liquid coating material, a flow velocity of the liquid coating material in the coating material tank, and a direction of flow of the liquid coating material in the tank.

Further, in accordance with one or more embodiments of the present invention, as a second aspect, the database is structured by collecting data of an angle of incline of the object, a surface tension caused between the object and the liquid coating material, a flow velocity of the liquid coating material in the coating material tank, and a direction of flow of the liquid coating material in the coating material tank when the air bubble adhering to the object is removed from the object.

In addition, in accordance with one or more embodiments of the present invention, as a third aspect of the invention, a method of simulating an occurrence of an air pocket in an object to be coated, is provided with:

an elements dividing step of dividing a shape data of the object to be immersed in a coating material tank into a plurality of elements;

a first determination step of determining whether an attribute regarding an element of the plurality of elements is air or liquid;

a calculation step of obtaining an air bubble removing factor F according to the following equation (1):

$$F = C1 \times C2\sigma \times C3\mu \times C4V \qquad (1); \text{ and}$$

a second determination step of
comparing a height $Z1$ of an element, which is determined in the first determination step that the attribute regarding the element is air, with a value obtained by adding the air bubble removing factor F to a height $Z2$ of a element, which is determined in the first determination step that the attribute regarding the element is liquid coating material, in elements adjoining the element which is determined that the attribute is air;

determining that the attribute of the element, which is determined that the attribute is air, is liquid coating material, when $Z1 \leq Z2+F$; and determining that the attribute of the element, which is determined that the attribute is air, is air, where $Z1 > Z2+F$.

Further, in accordance with one or more embodiments of the present invention, as a fourth aspect of the invention, the first determination step includes:

a first step of setting predetermined elements, among the elements obtained by division, to be an initial boundary element and an flanking element;

a second step of analyzing the flanking element set in the first step based on the initial boundary element;

a third step of setting the flanking element analyzed in the second step as a secondary boundary element, and setting an flanking element to be analyzed; and a fourth step of analyzing the flanking element set in the third step, based on the secondary boundary element.

In addition, in accordance with one or more embodiments of the present invention, as a fifth aspect, a program executable by a computer for simulating an occurrence of an air pocket in an object to be coated, is provided with:

a regions dividing step of dividing a shape data of the object to be immersed in a coating material tank and a data of a periphery of the object into a plurality of regions;

an elements dividing step of dividing the shape data of the object into a plurality of elements;

a first determination step of determining whether an attribute regarding an element of the plurality of elements is air or liquid; and a second determination step of determining whether the attribute regarding the element, which is determined in the first determination step that the attribute regarding the element is air, is air in a region to which the element belongs, by referring to a database, wherein the database relates to information indicating whether an air bubble adhering to the object is removed therefrom, based on an angle of incline of the object, a surface tension caused between the object and the liquid coating material, a flow velocity of the liquid coating material in the coating material tank, and a direction of flow of the liquid coating material in the tank.

Further, in accordance with one or more embodiments of the present invention, as a sixth aspect of the invention, the database is structured by collecting data of an angle of incline of the object, a surface tension caused between the object and the liquid coating material, a flow velocity of the liquid coating material in the coating material tank, and a direction of flow of the liquid coating material in the coating material tank when the air bubble adhering to the object is removed from the object.

In addition, in accordance with one or more embodiments of the present invention, as a seventh aspect, a program executable by a computer for simulating an occurrence of an air pocket in an object to be coated, is provided with:

an elements dividing step of dividing a shape data of the object to be immersed in a coating material tank into a plurality of elements;

a first determination step of determining whether an attribute regarding an element of the plurality of elements is air or liquid;

a calculation step of obtaining an air bubble removing factor F according to the following equation (1):

$$F = C1 \cdot C2s \cdot C3m \cdot C4V \quad (1); \text{ and}$$

a second determination step of comparing a height $Z1$ of an element, which is determined in the first determination step that the attribute regarding the element is air, with a value obtained by adding the air bubble removing factor F to a height $Z2$ of a element, which is determined in the first determination step that the attribute regarding the element is liquid coating material, in elements adjoining the element which is determined that the attribute is air;

determining that the attribute of the element, which is determined that the attribute is air, is liquid coating material, when $Z1 £ Z2+F$; and determining that the attribute of the element, which is determined that the attribute is air, is air, where $Z1 > Z2+F$.

Further, in accordance with one or more embodiments of the present invention, as a eighth aspect of the invention, the first determination step includes:

a first step of setting predetermined elements, among the elements obtained by division, to be an initial boundary element and an flanking element;

a second step of analyzing the flanking element set in the first step based on the initial boundary element;

a third step of setting the flanking element analyzed in the second step as a secondary boundary element, and setting an flanking element to be analyzed; and a fourth step of analyzing the flanking element set in the third step, based on the secondary boundary element. [0007]

According to the first and fifth aspects, whether an air bubble adhering to the object is removed therefrom can be determined according to the angle of incline of the object, the surface tension caused between the object and the liquid coating material, the flow velocity of the liquid coating material in the coating material tank, and the direction of flow of the liquid coating material in the tank. Thus, the accuracy of simulateion of an occurrence of an air pocket in the object can be enhanced.

According to the second and sixth aspects, whether an air bubble adhering to the object is removed therefrom can easily be determined by using the database that collects and relates data, which indicates whether an air bubble adhering to the object is removed therefrom, to an angle of incline of the object, a surface tension caused between the object and the liquid coating material, a flow velocity of the liquid coating material in the coating material tank, and a direction of flow of the liquid coating material in the coating material tank. Thus, the accuracy of determination on an occurrence of an air pocket in the object can be enhanced.

According to the third and seventh aspects, whether an air bubble adhering to the object is removed therefrom during the object is conveyed in the coating material tank can be determined according to the relation between the height $Z1$ of the element determined to be filled with air, and a value obtained by adding the air bubble removing factor F to the height $Z2$ of the element determined to be filled with the liquid coating material. Thus, the accuracy of simulateion of an occurrence of an air pocket in the object can be enhanced.

According to the fourth and eighth aspects, the analysis of a place on the object, to which an air bubble adheres, can easily be performed. Thus, the simulateion of an occurrence of an air pocket can quickly and accurately be achieved.

Other aspects and advantages of the invention will be apparent from the following description and the appended claims.

DETAILED DESCRIPTION OF THE EXEMPLARY EMBODIMENTS

Exemplary embodiments of the invention will be described with reference to the accompanying drawings. However, the scope of the invention is not limited to an illustrated example. Incidentally, the following description describes a case, in which electrodeposition coating is performed on a vehicle body, by way of example. A coating method, to which the invention can be applied, is not limited to the electrodeposition coating method. The invention can be applied to any other coating method, as long as the coating method is adapted to coat the object by immersing the object in the liquid coating material.

First Exemplary Embodiment

Figure 1:
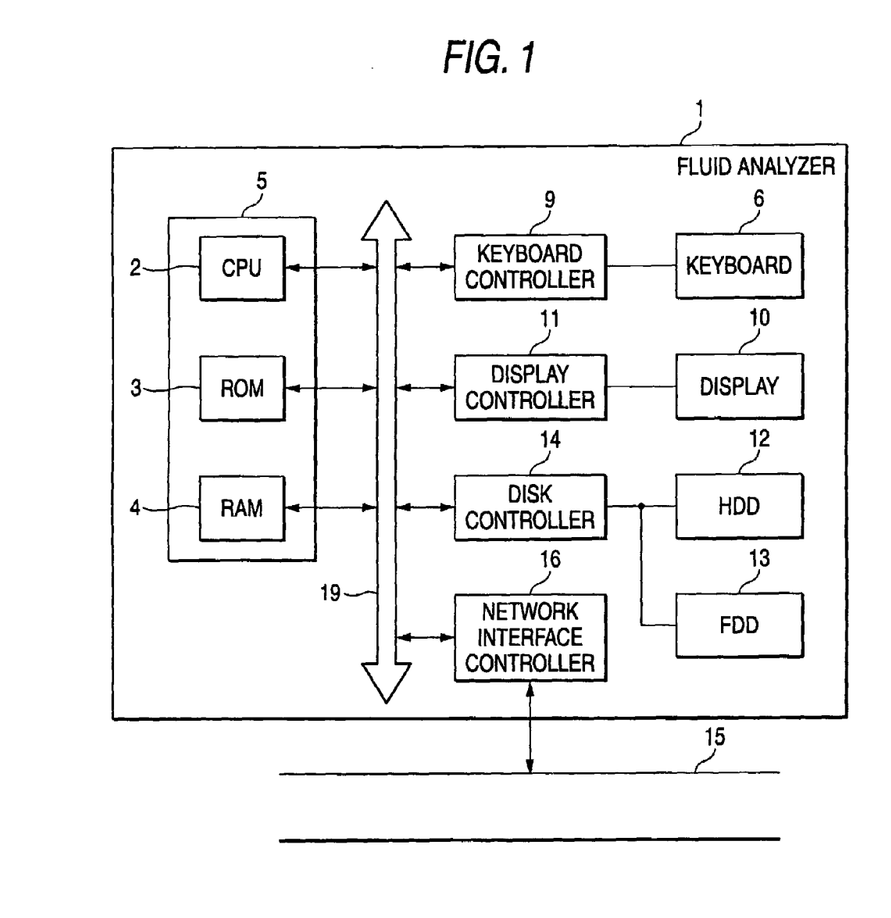
FIG. 1 is a schematic block diagram illustrating the configuration of a fluid analyzer.

FIG. 1 is a block diagram illustrating an example of the hardware configuration of a fluid analyzer 1 used to perform the method of simulating an occurrence of an air pocket in an object to be coated.

As shown in FIG. 1, the fluid analyzer 1 according to the exemplary embodiment includes a control portion 5, which has a CPU 2, a ROM 3, and a RAM 4, a keyboard controller 9 for a keyboard 6, a display controller 11 for a display unit 10 serving as a display portion, a disk controller 14 for a hard disk drive 12 and a flexible disk drive 13, and a network interface controller 16 for connection to a network 15, which are communicatably connected to one another through a system bus 19.

The CPU 2 is configured to comprehensively control the constituent portions connected to the system bus 19 by performing software stored in the hard disk drive 12 or software provided from the flexible disk drive 13. That is, the CPU 2 reads processing programs from the ROM 3, the hard disk drive 12, or the flexible disk drive 13 according to a predetermined processing sequence and performs the read processing programs to thereby control an operation of performing a method of simulating an occurrence of an air pocket in an object to be coated according to the exemplary embodiment. Further, the program may be read via a communication means from an external storage located in other device than the fluid analyzer 1.

The CPU 2 reads from the hard disk drive 12 a shape data representing a member to be analyzed. The CPU 2 is adapted to then divide the member and the periphery thereof into a plurality of cubic regions and to respectively assign consecutive unique numbers to the regions obtained by the division. Also, the CPU 2 is adapted to divide the vehicle body, which is an analysis object, into a plurality of two-dimensional or three-dimensional elements. Additionally, the CPU 2 is adapted to measure an angle of inclination of a member included in the region to be analyzed.

The ROM 3 stores a database relating to information, which indicates whether an air bubble adhering to the object is removed therefrom, to an angle of incline of the object, a surface tension caused between the object and the liquid coating material, a flow velocity of the liquid coating material in the coating material tank, and a direction of flow of the liquid coating material in the tank. Data collected by performing electrodeposition coating on an actual vehicle body in an electrodeposition tank, and data collected by using a simplified model, in which a panel imitating a part of a vehicle body is immersed in a tank filled with electrodeposition liquid and in which air bubbles and a flow of the electrodeposition liquid are subsequently and artificially generated, are stored in this database.

The RAM 4 functions as a main memory or a work area for the CPU 2. The keyboard controller 9 controls the input of instructions from the keyboard 6 and a pointing device (not shown). The display controller 11 controls the indication of data in the display unit 10. The disk controller 14 controls accesses to the hard disk drive 12 and the flexible disk drive 13, which store a boot program, various application programs, edit files, user files, a network management program, and predetermined processing programs according to this embodiment. The network interface controller 16 is adapted to bi-directionally transmit and receive data to and from an apparatus or a system provided on the network 15.

This method of simulating an occurrence of an air pocket in an object to be coated is configured to perform numerical analysis of electrodeposition liquid and a flow of air at the electrodeposition coating of the vehicle body. First, a vehicle body coating line is briefly described below.

Figure 2:
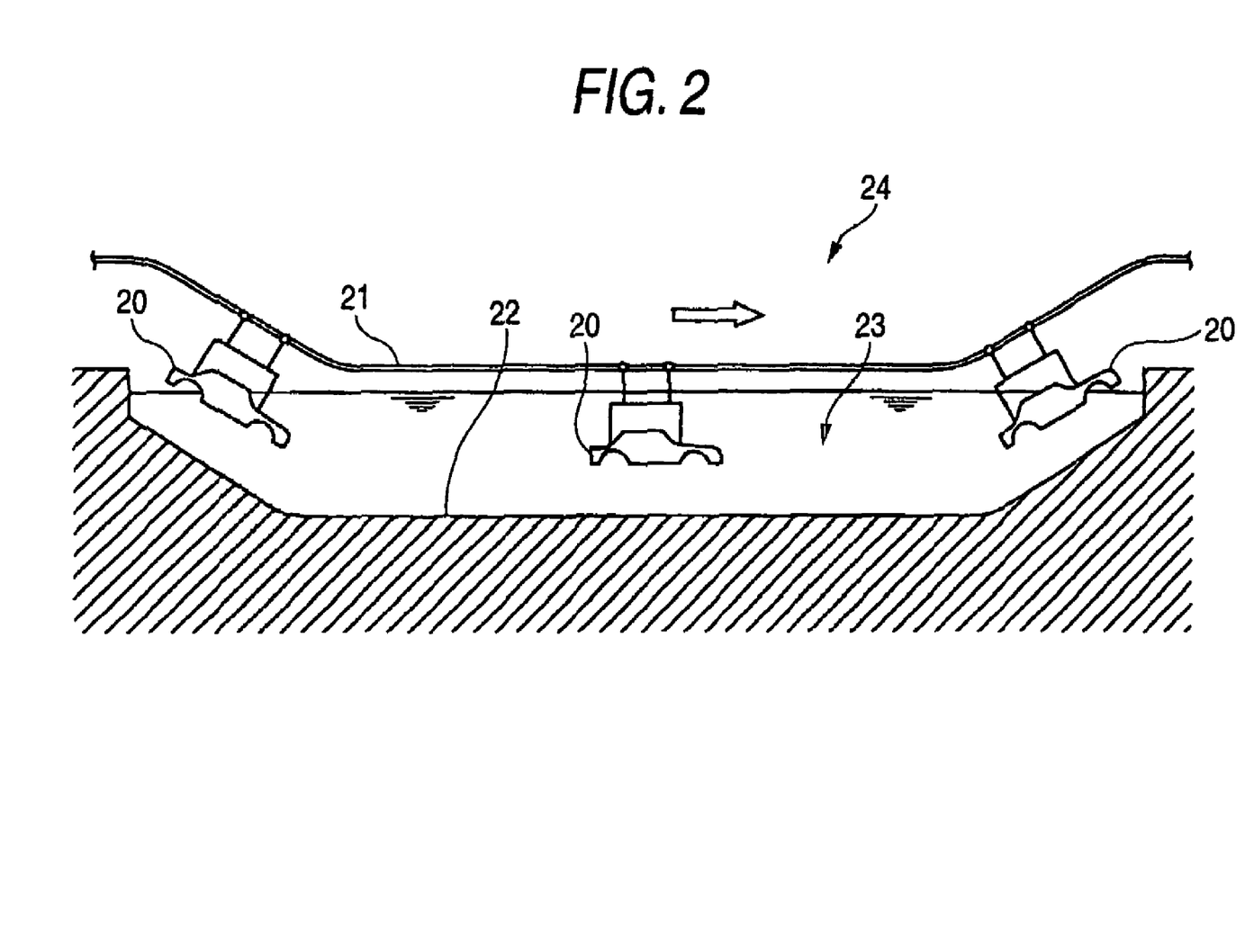
FIG. 2 is a schematically explanatory diagram illustrating a vehicle body coating line.

A vehicle body 20 is constructed by bonding a plurality of vehicle body panels through welding. As shown in FIG. 2, the vehicle bodies 20 are conveyed in a state, in which each of the vehicle bodies 20 is mounted on a hanger of a conveying apparatus 21, by the coating line in a substantially horizontal direction. Degreasing, water-washing, surface-conditioning, film transformation and water-washing are performed on the coating line as pretreatments for electrodeposition coating. Upon completion of such treatments, the vehicle body 20 serving as an automobile body downwardly goes toward an electrodeposition tank 22. Then, the vehicle body 20 is moved in a substantially horizontal direction while the vehicle body 20 is immersed in the electrodeposition liquid 23. In this state, a voltage is applied to each of the vehicle body 20 and an electrode (not shown) provided in the electrodeposition tank 22. Thus, the coating material is deposited on the vehicle body panel. Subsequently, the vehicle body 20 is upwardly drawn from the electrodeposition tank 22 by the conveying apparatus 21. Then, the electrodeposition liquid 23, which is not electrodeposited onto but adheres to the vehicle body panel, is removed by water-washing.

Figure 3:
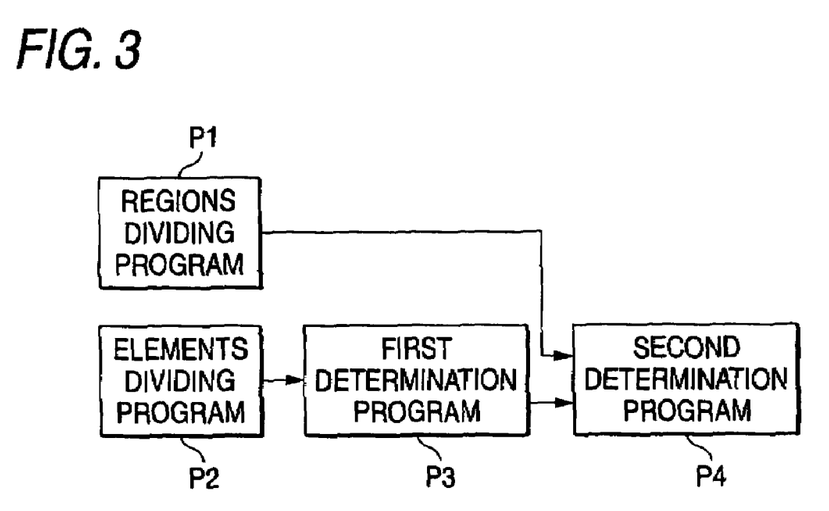
FIG. 3 is an explanatory diagram illustrating a control program according to the first exemplary embodiments.

Next, the program executable by a computer for executing the method of simulating the occurrence of the air pocket in the object to be coated is described with reference to FIG. 3 and 4. The program shown in FIG. 3 is a control program stored in ROM 3 or HDD 12 of the fluid analyzer 1, or provided from an outside storage via the network 15. The control program is executed by CPU 2. The control program includes: a regions dividing program P1 that executes a region dividing step of dividing a shape data of the object to be immersed in a coating material tank and a data of a periphery of the object into a plurality of regions; an elements dividing program P2 that executes an elements dividing step of dividing the shape data of the object into a plurality of elements; a first determination program P3 that executes a first determination step of determining whether an attribute regarding an element of the plurality of elements is air or liquid; and a second determination program P4 that executes a second determination step. In the second determination step, it is determined whether the attribute regarding the element, which is determined in the first determination step that the attribute regarding the element is air, is air in a region to which the element belongs, by referring to a database, wherein the database relates to information indicating whether an air bubble adhering to the object is removed therefrom, based on an angle of incline of the object, a surface tension caused between the object and the liquid coating material, a flow velocity of the liquid coating material in the coating material tank, and a direction of flow of the liquid coating material in the tank.

Figure 4:
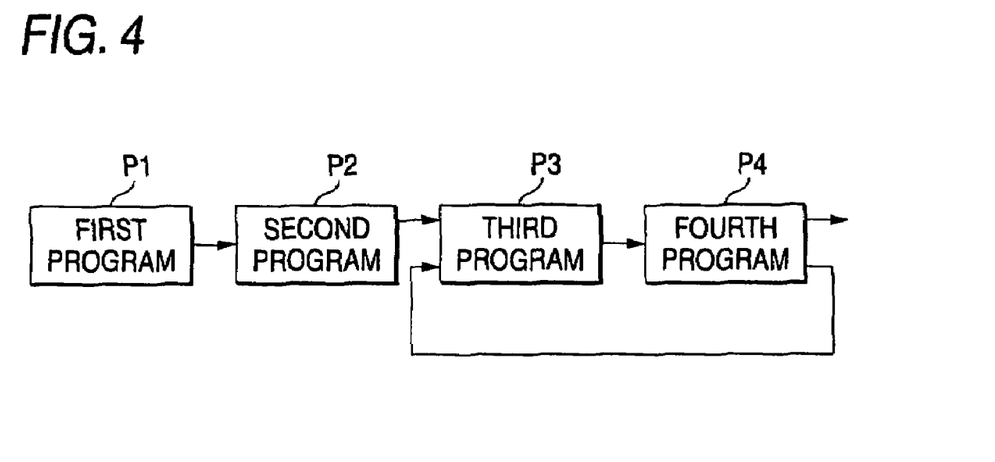
FIG. 4 is an explanatory diagram illustrating a first determination program.

As shown in FIG. 4, the first determination program P3 includes: a first program P5 for executing a first step; a second program P6 for executing a second step; a third program P7 for executing a third step; and a fourth program P8 for executing a fourth step.[0027]

Figure 5:
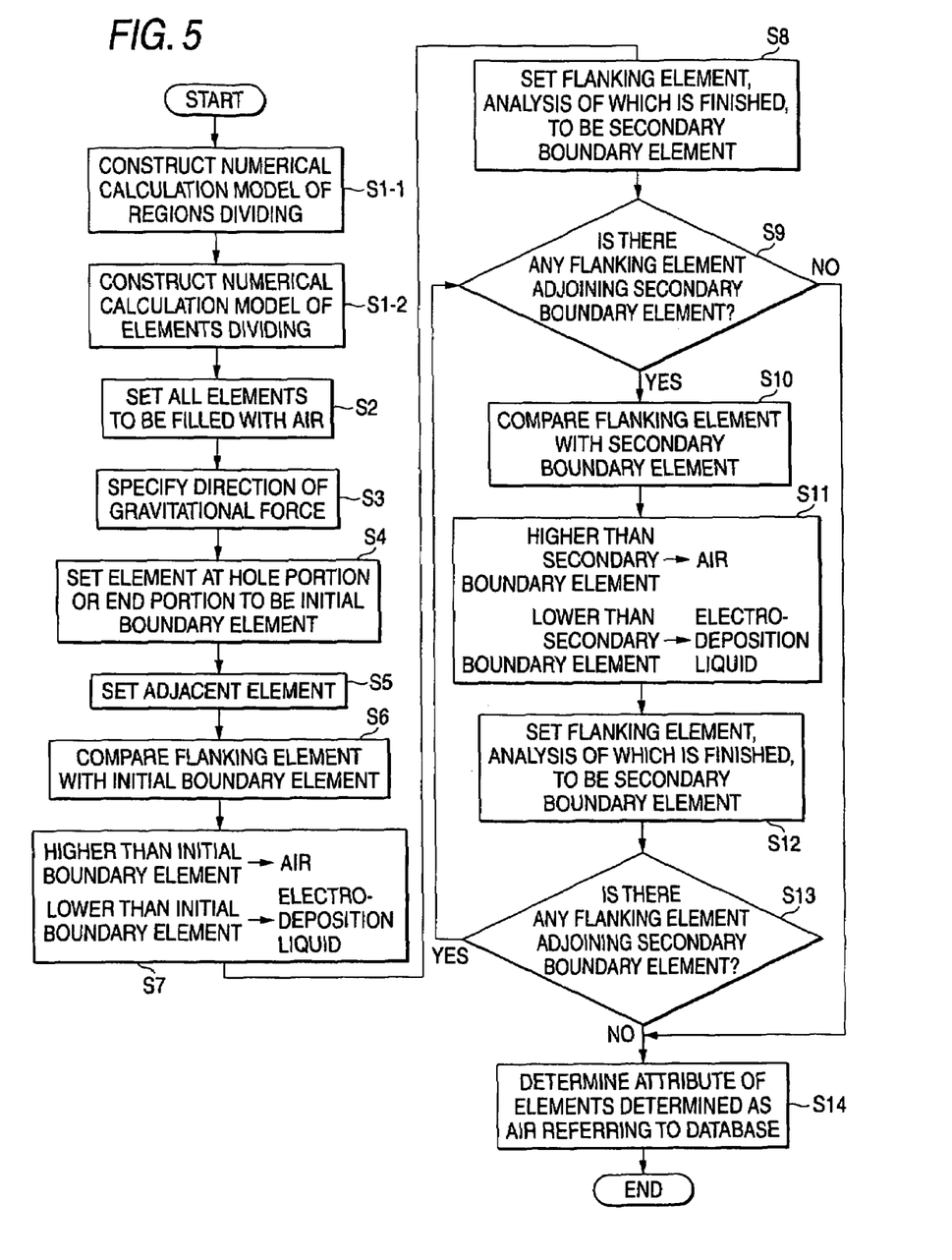
FIG. 5 is a flow chart of a method of simulating an occurrence of an air pocket in an object to be coated according to the first exemplary embodiment.

Hereinafter, a method of simulating an occurrence of an air pocket in an object to be coated according to the first exemplary embodiment is described with reference to a flow chart of FIG. 5.

Figure 6:
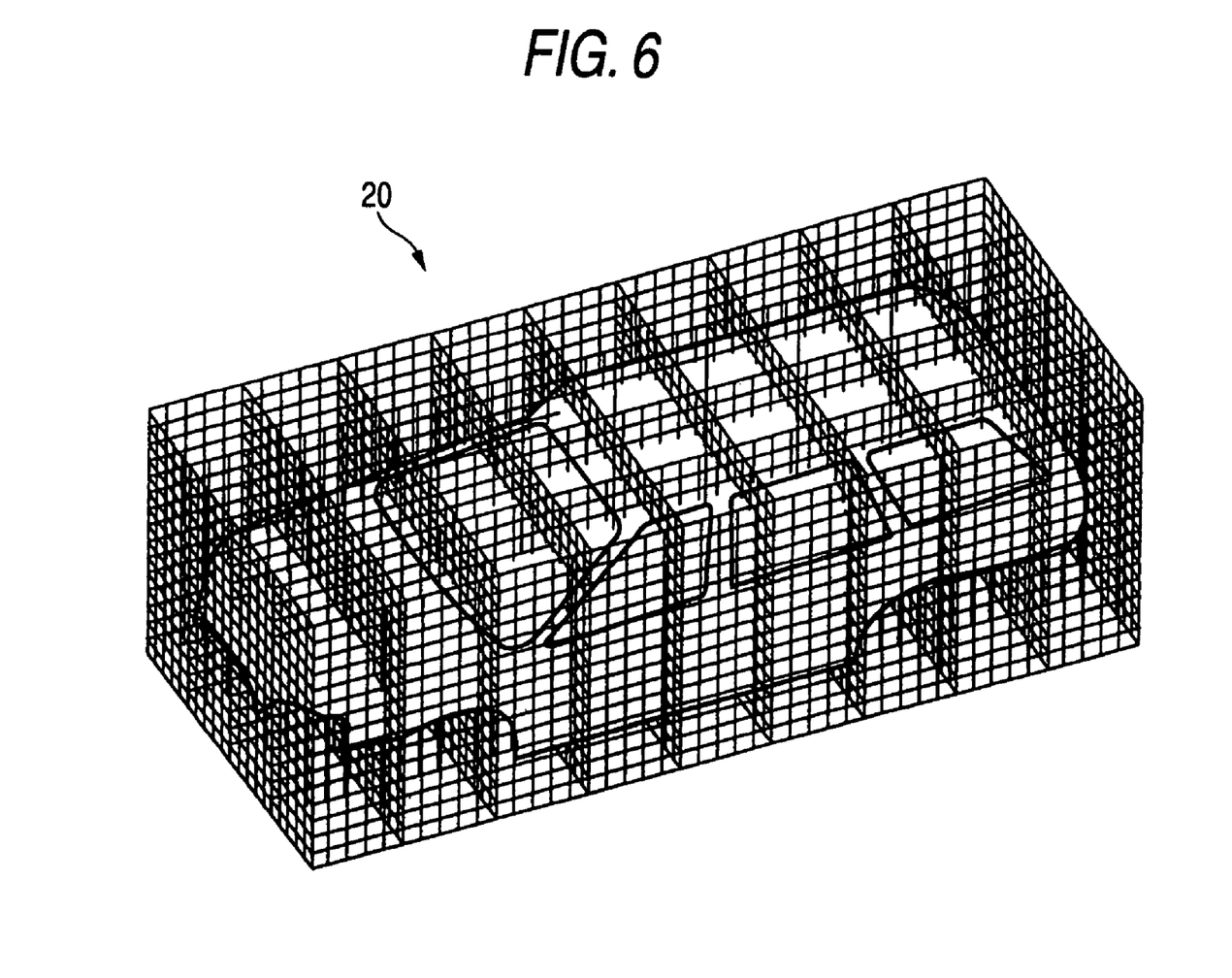
FIG. 6 is a perspective diagram illustrating a state in which a vehicle body is divided into a plurality of three-dimensional regions.

In the exemplary embodiment, analysis is performed by employing a finite element method. First, as illustrated in FIG. 6, the vehicle body 20 and the periphery thereof are divided into a plurality of cubic regions. Then, consecutive unique numbers are assigned to the regions obtained by division, respectively (STEP S1-1). Incidentally, although a three-dimensional numerical model is shown in FIG. 6, a two-dimensional numerical model may be employed. The above step S1-1 corresponds to the regions dividing program P1.

Subsequently, it is determined whether an air bubble adheres to the vehicle body 20 immersed in the electrodeposition tank 22. There is no particular limitation to this determination method. Hereinafter, the determination method is described with reference to the case of applying this determination method to whether an air bubble adheres to the floor panel 26 shown in FIG. 7 of the vehicle body 20, by way of example.

Figure 7:
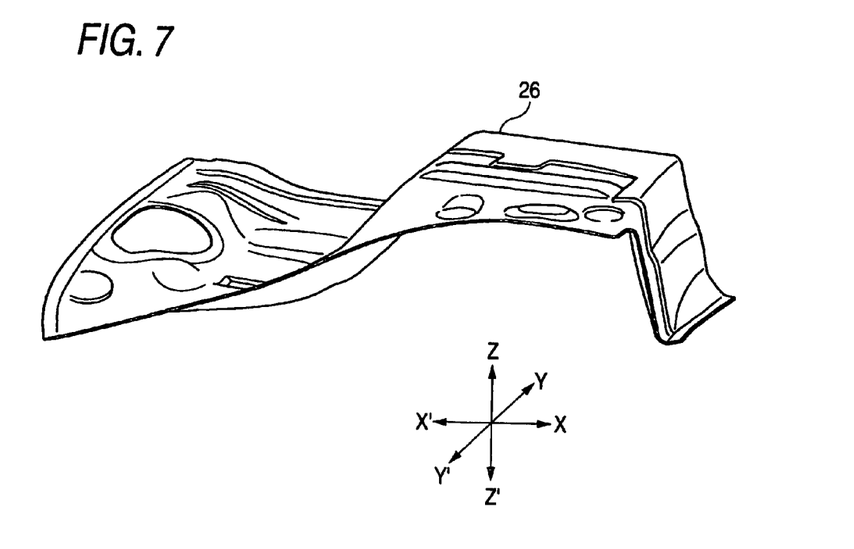
FIG. 7 is a schematically perspective diagram illustrating the floor panel.
Figure 8:
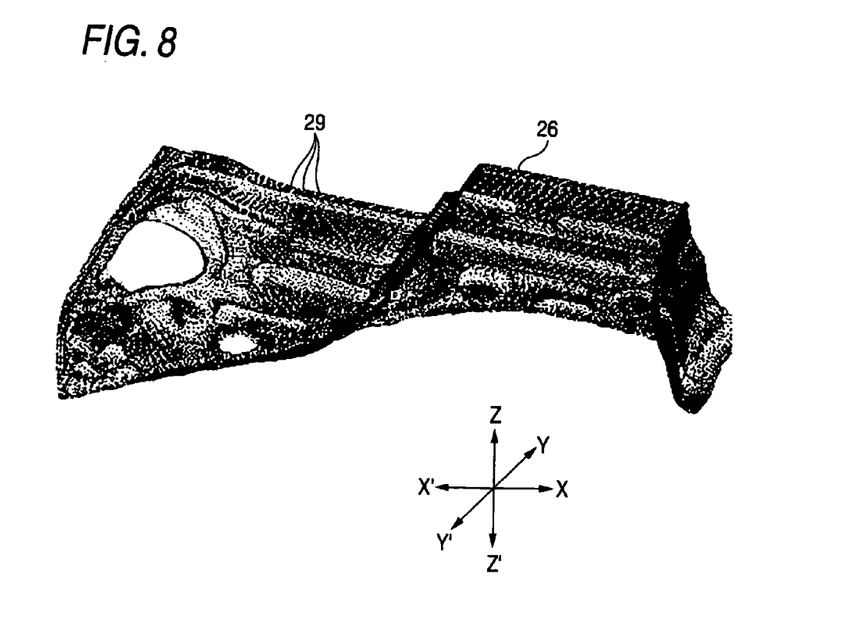
FIG. 8 is a diagram illustrating the floor panel divided into two-dimensional elements.

A surface of the floor panel 26 shown in FIG. 7 is divided into a plurality of elements 29, as shown in FIG. 8, so as to construct a two-dimensional numerical calculation model for numerical computation. (STEP S1-2) Further, although FIG. 8 shows the two-dimensional numerical calculation model, a three-dimensional numerical calculation model may be employed. The above step S1-2 corresponds to the elements dividing program P2.

Subsequently, in step S2, all of the elements 29 are set that the attributes are air, as an initial condition. Then, the control portion 5 specifies a direction of gravitational force in the numerical calculation model in step S3.

This condition indicates a condition, in which the periphery of the floor panel 26 is filled with air before the vehicle body 20 is put into the electrodeposition tank 22, in a simulated way.

Then, in step S4, the control portion 5 sets an element 29, which is present at an end portion or a hole portion of the floor panel 26, as an initial boundary element. Subsequently, in step S5, an flanking element to be compared with the boundary element is set. Incidentally, the initial boundary element is an element at an end portion or a hole portion of the floor panel 26 and is set to be filled with the electrodeposition liquid. The flanking element is an element having a nodal point with the initial boundary element or with the secondary boundary element and is compared with neither the initial boundary element nor the secondary boundary element yet. The nodal point is a point formed by bringing vertices of elements in contact with one another.

Subsequently, in step S6, the height in the Z-direction of a point of center of gravity of the initial boundary element is compared with that in the Z-direction of a point of center of gravity of the flanking element. Then, it is determined that the electrodeposition liquid 23 is forced into the element, the point of center of gravity of which is lower than that of center of gravity of the initial boundary element, against air 24, and that the flanking element, the point of center of gravity of which is lower than that of center of gravity of the initial boundary element, is filled with the electrodeposition liquid. Conversely, it is determined in step S7 that the air 24 remains in the flanking element, the point of center of gravity of which is higher than that of center of gravity of the initial boundary element. This determination is based on the fact that the specific gravity of the electrodeposition liquid is larger than that of air.

Figure 9A:
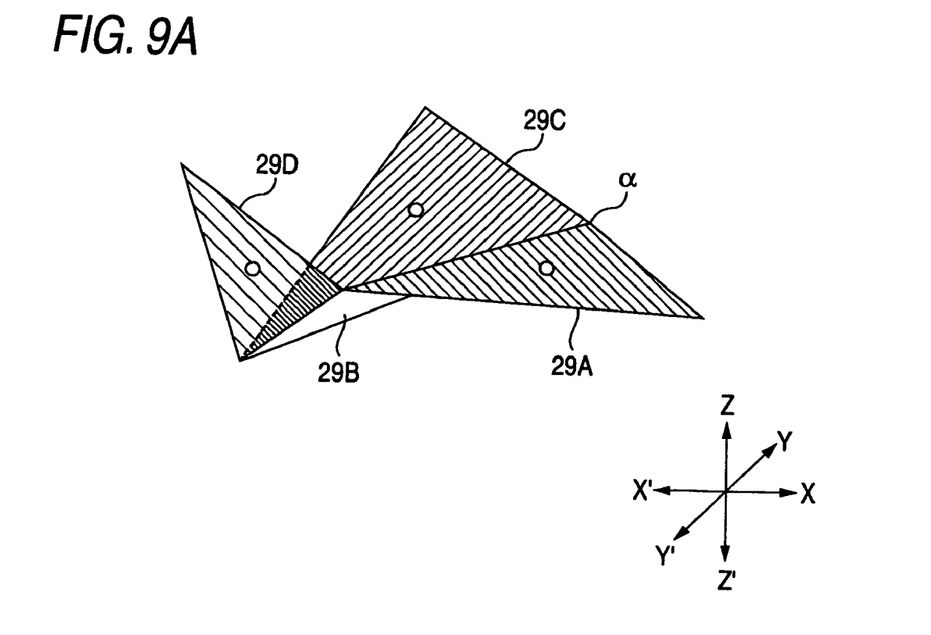
FIG. 9A is a diagram illustrating a part of the two-dimensional elements extracted from the floor panel.
Figure 9B:
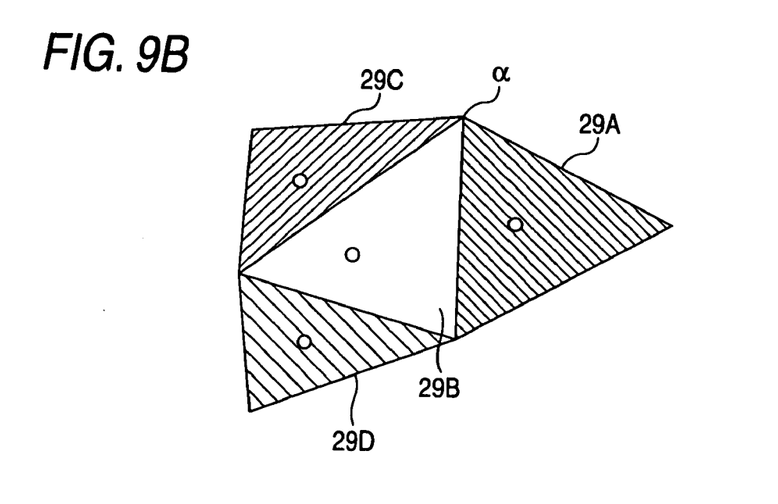
FIG. 9B is a top view of the elements shown in FIG. 9A.

This is more specifically described below. In a case where an element 29C shown in FIGS. 9A and 9B is set, and where an element 29A having a nodal point a in common with the initial boundary element is set to be an flanking element, the height in the Z-direction of the point of center of gravity of the initial boundary element 29C is compared with that in the Z-direction of the point of center of gravity of the flanking element 29A. In a case where the point of center of gravity of the flanking element 29A is lower than that of center of gravity of the initial boundary element 29C, it is determined that the flanking element 29A is filled with the electrodeposition liquid. Conversely, in a case where the point of center of gravity of the flanking element 29A is higher than that of center of gravity of the initial boundary element 29C, it is determined that the flanking element 29A is filled with air. This comparison method is similar to a comparison method performed in a case where the secondary boundary element, which will be described later, is compared with the flanking element.

Subsequently, in step S8, the flanking element, which has already been compared with the initial boundary element, is set to be a secondary boundary element. Then, it is determined in step S9 whether there is any flanking element adjoining the newly set secondary boundary element. Incidentally, the secondary boundary element is an element that has already been compared with the initial boundary element or another secondary boundary element.

If it is determined that there is no flanking element (NO in step S9), the analysis is finished. Conversely, if it is determined that there is an flanking element (YES in step S9), the analysis of the flanking element is performed in step S10 by comparing the height of the point of center of gravity of the secondary boundary element with that of the point of center of gravity of the flanking element. If the height of the point of center of gravity of the flanking element is lower than that of the point of center of gravity of the secondary boundary element to be compared, it is determined in step S11 that the flanking element is filled with the electrodeposition liquid 23.

If the height of the point of center of gravity of the flanking element is higher than that of the point of center of gravity of the secondary boundary element to be compared, it is determined in step S11 that the flanking element is filled with the air 24. In step S12, the flanking element, the analysis of which is finished, is set to be a secondary boundary element.

Subsequently, in step S13, it is determined whether there is any flanking element adjoining the newly set secondary boundary element. If it is determined that there is an flanking element (YES in step S13), the analysis of the flanking element is performed by comparing the height of the point of center of gravity of the secondary boundary element with that of the point of center of gravity of the flanking element in step S10. If it is determined that there is no flanking element (NO in step S10), the analysis for respective elements is finished.

The above steps S2 to S13 correspond to the first determination program P3. In operations of the steps S2 to S13 by the first determination program P3, the steps S4 and S5 correspond to the first program P5 (the first step), and the steps S6 and S7 correspond to the second program P6 (the second step). In addition, the steps S8 and S9 correspond to the third program P7 (the third step), and the steps s10 and S11 correspond to the fourth program P8 (the fourth step).

Incidentally, in a case where there are plural initial or secondary boundary elements corresponding to an flanking element, the flanking element is compared with all the initial boundary elements (or the secondary boundary elements). If it is determined that the height of the point of center of gravity of the flanking element is lower than one of the initial boundary elements or the secondary boundary elements which are filled with the electrodeposition liquid, this flanking element is determined to be filled with the electrodeposition liquid. Thus, it is determined whether air bubbles adhere to the entire vehicle body 20.

As described above, the vehicle body 20 immersed in the electro deposition tank 22 is divided into a plurality of elements. Then, it is determined that each of the elements is filled with air or electrodeposition liquid. Subsequently, regions each including the element determined to be filled with air are selected. The flow velocity and the direction of flow of the electrodeposition liquid in the region, to which the smallest number among the unique numbers assigned to the selected regions is assigned, are measured. Also, an angle of inclination of an inclined portion of the panel of the vehicle body 20, which is present in the selected regions, is measured. Also, a surface tension caused between the panel of the vehicle body 20 and the electrodeposition liquid is measured by a known method.

Figure 10:
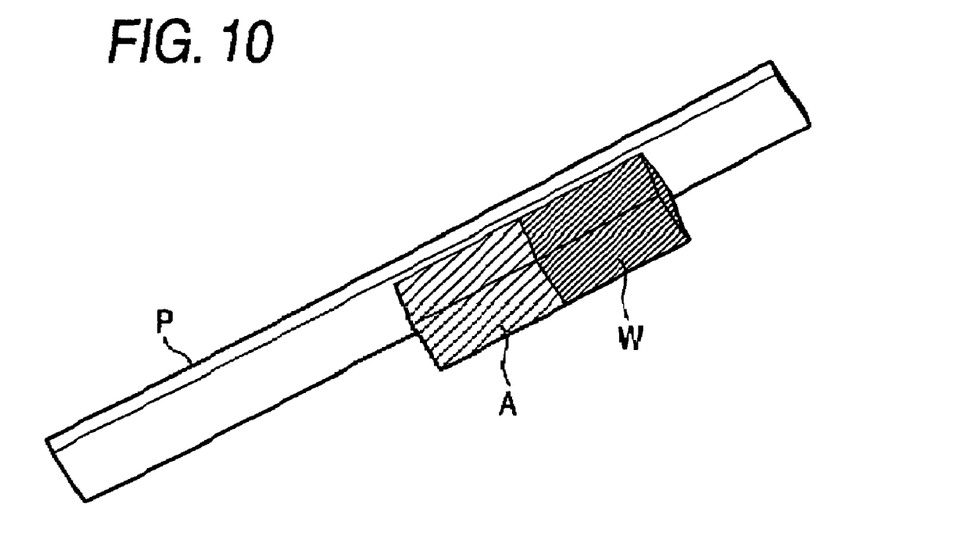
FIG. 10 is a diagram showing an elements dividing of three-dimensional in a state in which air bubbles adhere to a vehicle body panel.

When the angle of inclination is measured, a two-dimensional element determined to be filled with air is set to be an air bubble element Y, and an element adjoining the air bubble element Y in the direction of inclination of the panel P of the vehicle body 20 is set to be an electrodeposition liquid element W, as illustrated in, for example, FIG. 10. Each of the elements Y and W is shaped like a rectangular parallelepiped.

Figure 11:
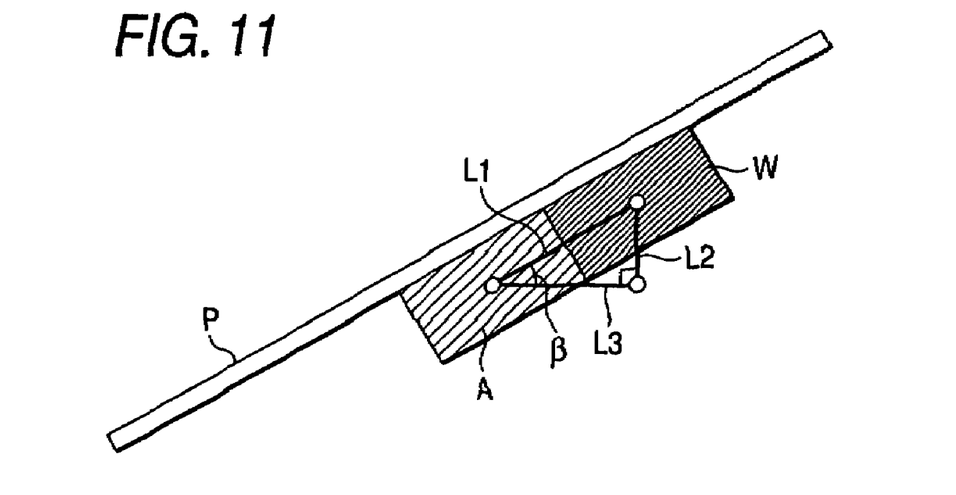
FIG. 11 is a diagram used to derive an angle of inclination of the vehicle body panel.

Subsequently, as illustrated in FIG. 11, reference numeral L1 designates a line connecting the point of center of gravity of the air bubble element Y to that of center of gravity of the electrodeposition liquid element W. Reference numeral L2 denotes a vertical line drawn vertically downwardly from the point of center of gravity of the electrodeposition liquid element W. Also, a horizontal line L3 passing through the point of center of gravity of the air bubble element Y and intersecting with the vertical line L2 is drawn. Then, an angle formed between the line L1 and the horizontal line L3 is measured by a known method to thereby derive an angle β of inclination of the vehicle body panel P. Subsequently, whether an air bubble adhering to the vehicle body panel P, which is present in the selected regions, is removed therefrom is determined by using the database that is stored in the ROM 3 and that collects and relates data, which indicates whether an air bubble adhering to the vehicle body panel P is removed therefrom, to an angle of incline of the vehicle body panel P, a surface tension caused between the vehicle body panel P and the electrodeposition liquid, a flow velocity of the electrodeposition liquid in the electrodeposition liquid tank 22, and a direction of flow of the electrodeposition liquid in the tank (STEP S14). The above step S14 corresponds to the second determination program P4.

This analysis operation is performed on all the regions, each of which includes the element determined to be filled with air, in the ascending order of the number assigned to each of such regions. Upon completion of analysis of all of such regions, the analysis operation is finished.

According to the first exemplary embodiment, whether an air bubble adhering to the vehicle body 20 is removed therefrom is determined in consideration of an angle of incline of a part of the vehicle body, to which an air bubble adheres, a surface tension caused between the vehicle body panel and the electrodeposition liquid, a flow velocity of the electrodeposition liquid in the electrodeposition liquid tank 22, and a direction of flow of the electrodeposition liquid in the tank. Thus, the precision of simulateion of an occurrence of an air pocket can be enhanced.

The precision of determination made on whether an air pocket occurs in the vehicle body 20 can be enhanced by using the database that collects and relates data, which indicates a case in which an air bubble adhering to the vehicle body is removed therefrom, to an angle of incline of the vehicle body, a surface tension caused between the vehicle body and the electrodeposition liquid, a flow velocity of the electrodeposition liquid in the electrodeposition liquid tank, and a direction of flow of the electrodeposition liquid in the tank.

Second Exemplary Embodiment

A second exemplary embodiment of the invention is described below. Incidentally, the description of components of the second exemplary embodiment, which are similar to those of the first exemplary embodiment, is omitted. The following description of the second exemplary embodiment is focused on differences from the aforementioned first exemplary embodiment of the invention.

A height Z1 of the element determined to be filled with air is compared with a value obtained by adding an air bubble removing factor F, which is computed according to the following equation (1) and is stored in the ROM 3, to a height Z2 of the element determined to be filled with the electrodeposition liquid. Thus, it is determined whether an air bubble adhering to the vehicle body panel is removed therefrom.

$$F = C1 \times C2\sigma \times C3\mu C4V \tag{1}$$

That is, in a case where $Z1 \leq Z2+F$, it is determined that the air bubble adhering to the vehicle body is removed therefrom. In a case where $Z1 > Z2+F$, it is determined that the air bubble adhering to the vehicle body is not removed therefrom.

Incidentally, C1, C2, C3, and C4 designate coefficients derived to obtain an appropriate air bubble removing factor F by performing electrodeposition coating on an actual vehicle body in an electrodeposition liquid tank or by using a simplified model. Additionally, $\sigma$, $\mu$ and V denote a surface tension generated in a surface of the vehicle body panel, a viscosity of the electrodeposition liquid, and a movement speed of the vehicle body 20 in the electrodeposition liquid tank, respectively.

Figure 12:
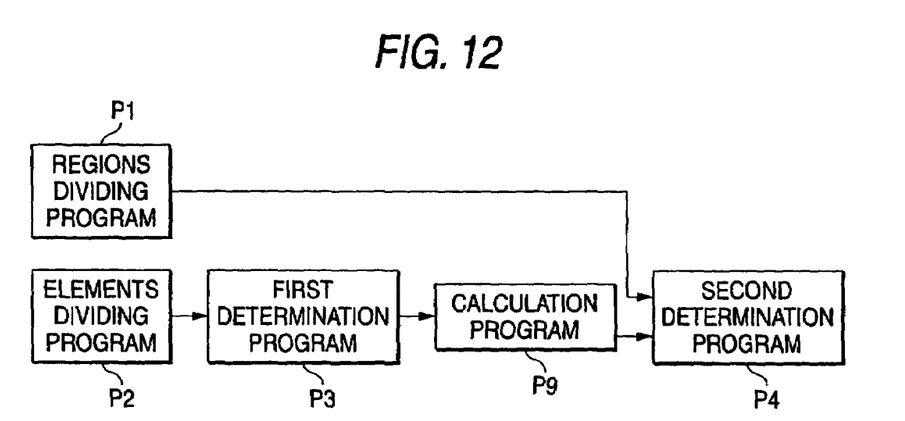
FIG. 12 is an explanatory diagram illustrating an control program according to the second exemplary embodiments.

FIG. 12 shows a program for a computer that executes the method of simulating an occurrence of an air pocket in an object to be coated according to the second exemplary embodiment. The program shown in FIG. 12 is a control program a control program stored in ROM 3 or HDD 12 of the fluid analyzer 1 shown in FIG. 1, or provided from an outside storage via the network 15.

The control program of the second exemplary embodiments is a program in which a calculation program P9 for executing a calculation step of the air bubble removing factor F is added to the control program of the first exemplary embodiments including the regions dividing program P1, the elements dividing program P2, the first determination program P3, and the second determination program P4. The calculation program P9 calculates the air bubble removing factor F based on a determination result of the first determination program P3, and sends to the second determination program P4 the calculated air bubble removing factor F.

Hereinafter, a method of simulating an occurrence of an air pocket in an object to be coated according to the second exemplary embodiment is described below.

Even in this embodiment, analysis is performed by employing the finite element method. Similarly to the first exemplary embodiment, first, as illustrated in FIG. 6, the vehicle body 20 and the periphery thereof are divided into a plurality of cubic regions. Then, consecutive unique numbers are respectively assigned to the regions obtained by division.

Subsequently, according to techniques similar to those used in the first exemplary embodiment, it is determined whether an air bubble adhering to the vehicle body 20 immersed in the electrodeposition liquid tank 22. There is no limitation to such determination techniques even in the second exemplary embodiment.

Then, the vehicle body 20 immersed in the electrodeposition liquid tank 22 is divided into a plurality of elements. Subsequently, it is determined whether each of the elements is filled with air or the electrodeposition liquid. Then, the regions each including the element determined to be filled with air are selected. A two-dimensional element belonging to the region, to which the smallest number among the unique numbers assigned to the selected regions is assigned, among the selected regions, is set to be an air bubble element Y. An element adjoining the air bubble element Y in the direction of inclination of the panel P of the vehicle body 20 is set to be an electrodeposition liquid element W. Each of the elements Y and W is shaped like a rectangular parallelepiped. Then, the height Z1 of the air bubble element Y and the height Z2 of the electrodeposition liquid element W are measured.

Subsequently, the height Z1 of the air bubble element is compared with a value obtained by adding the air bubble removing factor F, which is computed according to the equation (1), to the height Z2 of the electrodeposition liquid element. Then, in a case where Z1≦Z2+F, it is determined that the air bubble adhering to the vehicle body panel P is removed therefrom. In a case where Z1>Z2+F, it is determined that the air bubble adhering to the vehicle body panel P is not removed therefrom.

This analysis operation is performed on all the regions, each of which includes the element determined to be filled with air, in the ascending order of the number assigned to each of such regions. Upon completion of analysis of all of such regions, the analysis operation is finished.

As described above, according to the second exemplary embodiment, whether an air bubble adhering to the vehicle body 20 is removed therefrom is determined by comparing the height Z1 of the air bubble element Y with a value obtained by adding the air bubble removing factor F, which is computed according to the equation (1), to the height Z2 of the electrodeposition liquid element W. Thus, the precision of simulateion of an occurrence of an air pocket in the vehicle body 20 can be enhanced.

Incidentally, the first to fourth methods of the invention can be applied not only to the electrodeposition coating of a vehicle body but to cleaning of a plating process tank.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of simulating an occurrence of an air pocket in an object to be coated, the method comprising:
   dividing a shape data of the object to be immersed in a coating material tank and a data of a periphery of the object into a plurality of regions;
   dividing the shape data of the object into a plurality of elements;
   determining whether an attribute regarding an element of the plurality of elements is air or liquid; and
   determining, when the attribute regarding the element is air, whether the attribute regarding the element remains air in a region to which the element belongs, by referring to a database, wherein the database relates to information indicating whether an air bubble adhering to the object is removed therefrom, based on an angle of incline of the object, a surface tension caused between the object and a liquid coating material, a flow velocity of the liquid coating material in the coating material tank, and a direction of flow of the liquid coating material in the coating material tank.

2. The method according to claim 1, wherein said object is divided into one of a three-dimensional model and a two-dimensional model.

3. The method according to claim 1, wherein a direction of gravitational force is associated with said elements.

4. The method according to claim 1, wherein said database stores data obtained by collecting data based on performing an electrodeposition coating on a vehicle and data collected by using a simplified model, in which a panel imitating a part of a vehicle body is immersed in a tank filled with an electrodeposition liquid and in which air bubbles and a flow of electrodeposition liquid are subsequently and artificially generated.

5. The method according to claim 1, wherein the information indicating whether an air bubble adhering to the object is removed therefrom is determined by a method comprising:
   obtaining an air bubble removing factor F according to the equation:

$$F = C1 \times C2\sigma \times C3\mu \times C4V,$$

wherein σ comprises a surface tension, μ comprises a viscosity of the liquid, V comprises the velocity of the liquid against said element and C1, C2, C3, and C4 comprise coefficients; and
   conducting a determination comprising:
      comparing a height Z1 of an element, which is determined that the attribute regarding the element comprises air, with a value obtained by adding the air bubble removing factor F to a height Z2 of a second element, which is determined that the attribute regarding the element comprises liquid coating material in the first determination, in elements adjoining the element which is determined that the attribute comprises air;

determining that the attribute of the element, which is determined that the attribute is air, is liquid coating material, when $Z1 \leq Z2+F$; and determining that the attribute of the element, which is determined that the attribute is air, is air, when $Z1 > Z2+F$.

6. The method according to claim 1, wherein the database is structured by collecting data of an angle of incline of the object, a surface tension caused between the object and the liquid coating material, a flow velocity of the liquid coating material in the coating material tank, and a direction of flow of the liquid coating material in the coating material tank when the air bubble adhering to the object is removed from the object.

7. The method according to claim 1, wherein determining whether an attribute regarding an element of the plurality of elements is air or liquid comprises:

setting predetermined elements, among the elements obtained by division, to be an initial boundary element and a flanking element;

analyzing the flanking element based on the initial boundary element;

setting the analyzed flanking element as a secondary boundary element, and setting an other flanking element to be analyzed; and analyzing the other flanking element, based on the secondary boundary element.

8. The method according to claim 7, wherein the analyzing the flanking element based on the initial boundary element includes comparing a height in a Z-direction of a point of center of gravity of the initial boundary element with a height in the Z-direction of a point of center of gravity of the flanking element.

9. The method according to claim 8, wherein the attribute regarding the element comprises liquid if the point of center of gravity of the flanking element is lower than that of the point of center of gravity of the initial boundary element, and wherein the attribute regarding the element comprises liquid if the point of center of gravity of the flanking element is higher than that of the point of center of gravity of the initial boundary element.

10. The method according to claim 7, wherein a plurality of initial boundary elements or a plurality of secondary boundary elements corresponding to a flanking element are compared with said flanking element.

11. The method according to claim 10, wherein if a center of gravity of said flanking element is lower than a center of gravity of any one of said plurality of initial boundary elements or any one of said plurality of a center of gravity of secondary boundary elements, said flanking element is deemed to be filled with liquid.

12. A method of simulating an occurrence of an air pocket in an object to be coated, the method comprising:

dividing a shape data of the object to be immersed in a coating material tank into a plurality of elements;

conducting a first determination comprising determining whether an attribute regarding an element of the plurality of elements is air or liquid;

obtaining an air bubble removing factor F according to the equation:

$$F = C1 \times C2\sigma \times C3\mu \times C4V,$$

wherein $\sigma$ comprises a surface tension, $\mu$ comprises a viscosity of the liquid, V comprises the velocity of the liquid against said element and C1, C2, C3, and C4 comprise coefficients; and conducting a second determination comprising:

comparing a height Z1 of an element, which is determined that the attribute regarding the element is air in the first determination, with a value obtained by adding the air bubble removing factor F to a height Z2 of a second element, which is determined that the attribute regarding the element is a liquid coating material in the first determination, in elements adjoining the element which is determined that the attribute is air;

determining that the attribute of the element, which is determined that the attribute is air, is liquid coating material, when $Z1 \leq Z2+F$; and determining that the attribute of the element, which is determined that the attribute is air, is air, where $Z1 > Z2+F$.

13. The method according to claim 12, wherein V comprises a movement speed of a vehicle body in an electrodeposition liquid tank.

14. The method according to claim 12, wherein at least one of the said dividing the shape data, said conducting a first determination, said obtaining the air bubble removing factor, said comparing the height, and said determining the attribute of the element employs a finite element method.

15. The method according to claim 12, wherein the surface tension comprises a surface tension caused between the object and the liquid.

16. The method according to claim 12, wherein the first determination includes:

setting predetermined elements, among the elements obtained by division, to be an initial boundary element and a flanking element;

analyzing the flanking element set based on the initial boundary element;

setting the flanking element analyzed in the second step as a secondary boundary element, and setting an other flanking element to be analyzed; and analyzing the other flanking element, based on the secondary boundary element.

17. A program comprising a set of instructions executable by a computer for executing a method of simulating an occurrence of an air pocket in an object to be coated, the method comprising:

dividing a shape data of the object to be immersed in a coating material tank and a data of a periphery of the object into a plurality of regions;

dividing the shape data of the object into a plurality of elements;

determining whether an attribute regarding an element of the plurality of elements is air or liquid; and determining whether the attribute regarding the element, when the attribute regarding the element is air, remains air in a region to which the element belongs, by referring to a database, wherein the database relates to information indicating whether an air bubble adhering to the object is removed therefrom, based on an angle of incline of the object, a surface tension caused between the object and a liquid coating material, a flow velocity of the liquid coating material in the coating material tank, and a direction of flow of the liquid coating material in the coating material tank.

18. The program according to claim 17, wherein the database is structured by collecting data of an angle of incline of the object, a surface tension caused between the object and the liquid coating material, a flow velocity of the liquid coating material in the coating material tank, and a direction of flow of the liquid coating material in the coating material tank when the air bubble adhering to the object is removed from the object.

19. The program according to claim 17, wherein determining whether an attribute regarding an element of the plurality of elements is air or liquid comprises:

setting predetermined elements, among the elements obtained by division, to be an initial boundary element and a flanking element;

analyzing the flanking element based on the initial boundary element;

setting the flanking element analyzed as a secondary boundary element, and setting an other flanking element to be analyzed; and analyzing the other flanking element, based on the secondary boundary element.

20. A program comprising a set of instructions executable by a computer for executing a method of simulating an occurrence of an air pocket in an object to be coated, the method comprising:

dividing a shape data of the object to be immersed in a coating material tank into a plurality of elements;

conducting a first determination comprising determining whether an attribute regarding an element of the plurality of elements is air or liquid;

obtaining an air bubble removing factor F according to the equation:

$$F = C1 \times C2\sigma \times C3\mu \times C4V,$$

wherein $\sigma$ comprises a surface tension, $\mu$ comprises a viscosity of the liquid, V comprises the velocity of the liquid against said element and C1, C2, C3, and C4 comprise coefficients; and conducting a second determination comprising:

comparing a height Z1 of an element, which is determined that the attribute regarding the element comprises air in the first determination, with a value obtained by adding the air bubble removing factor F to a height Z2 of a second element, which is determined that the attribute regarding the element comprises liquid coating material in the first determination, in elements adjoining the element which is determined that the attribute comprises air;

determining that the attribute of the element, which is determined that the attribute is air, is liquid coating material, when $Z1 \leq Z2+F$; and determining that the attribute of the element, which is determined that the attribute is air, is air, where $Z1 > Z2+F$.

21. The program according to claim 20, wherein said determining whether an attribute regarding an element of the plurality of elements is air or liquid comprises:

setting predetermined elements, among the elements obtained by division, to be an initial boundary element and a flanking element;

analyzing the flanking element based on the initial boundary element;

setting the flanking element analyzed as a secondary boundary element, and setting an other flanking element to be analyzed; and analyzing the other flanking element, based on the secondary boundary element.

* * * * *